United States Patent [19]

Leiphart et al.

[11] Patent Number: 5,705,042
[45] Date of Patent: Jan. 6, 1998

[54] ELECTRICALLY ISOLATED COLLIMATOR AND METHOD

[75] Inventors: Shane P. Leiphart, Boise; Richard L. Elliot, Meridian, both of Id.

[73] Assignee: Micron Technology, Inc., Boise, Id.

[21] Appl. No.: 629,440

[22] Filed: Apr. 8, 1996

Related U.S. Application Data

[63] Continuation-in-part of Ser. No. 593,227, Jan. 29, 1996, abandoned.

[51] Int. Cl.[6] .................................. C23C 14/34
[52] U.S. Cl. .......................... 204/192.12; 204/192.3; 204/298.06; 204/298.11
[58] Field of Search .................. 204/192.12, 192.3, 204/298.06, 298.11

[56] References Cited

U.S. PATENT DOCUMENTS

| | | | |
|---|---|---|---|
| 5,223,108 | 6/1993 | Hurwitt | 204/192.12 |
| 5,330,628 | 7/1994 | Demaray et al. | 204/192.12 |
| 5,346,601 | 9/1994 | Barada et al. | 204/192.15 |
| 5,403,459 | 4/1995 | Guo | 204/192.32 |
| 5,409,587 | 4/1995 | Sandhu et al. | 204/192.12 |
| 5,431,799 | 7/1995 | Mosely et al. | 204/298.06 |
| 5,478,455 | 12/1995 | Actor et al. | 204/192.13 |
| 5,482,611 | 1/1996 | Helmer et al. | 204/298.17 |
| 5,549,802 | 8/1996 | Guo | 204/298.11 |

FOREIGN PATENT DOCUMENTS 6-10125  1/1994  Japan .................. 204/298.11

OTHER PUBLICATIONS

Tetsuya, et al. *Patent Abstracts of Japan*, vol. 18, No. 215 (C-1191), Publication No. 6-10125, Jan. 18, 1994.

*Primary Examiner*—Aaron Weisstuch
*Attorney, Agent, or Firm*—Trask, Britt & Rossa

[57] ABSTRACT

Disclosed is a collimator, where the collimator is mounted within a sputter chamber and is interposed between a sputter target and a wafer to be coated with a thin film of the sputtered material. The collimator of the present invention is preferably mounted within the sputter chamber in an insulated manner so that the collimator is electrically insulated from the chamber and the collimator is able to take on a floating electrical potential of the plasma generated within the sputter chamber. The wafer is preferably rf-biased to effectuate a selective, reduced-rate sputtering of portions of the deposited film to inhibit premature pinch off by the film of recessed areas of the wafer.

23 Claims, 3 Drawing Sheets

ELECTRICALLY ISOLATED COLLIMATOR AND METHOD

This application is a continuation-in-part of application Ser. No. 08/593,227, filed Jan. 29, 1996, now abandoned.

BACKGROUND OF THE INVENTION

1. Field of the Invention

This invention relates to a collimator for use in sputter deposition of films on semiconductor wafers, and a method for using the same. More specifically, the invention relates to the use of a collimator at a free-floating electrical potential, preferably in combination with a negative bias to the wafer, for enhanced step coverage of the wafer.

2. State of the Art

Sputtering is a method of depositing thin metal and insulating films onto semiconductor wafers. The term "sputtering" describes a physical mechanism in which atoms are dislodged from the surface of a material by collision with high energy particles. Sputtering has become a widely utilized deposition technique for a variety of metallic films in semiconductor and integrated circuit (IC) fabrication, including aluminum, aluminum alloys, platinum, gold, tungsten, and titanium:tungsten. Sputtering is also used in some applications to deposit molybdenum, Si, $SiO_2$ (silica glass), and refractory metal silicides, although CVD (chemical vapor deposition) or evaporation may be more frequently used for deposition of such materials.

Sputtering takes place in an evacuated chamber. In general, the sputtering process may be summarized in four steps: 1) ions are generated and directed at a target; 2) the ions sputter (dislodge) target atoms; 3) the ejected (sputtered) atoms are transported to the substrate, where 4) they condense and form a thin film.

The energetic particles used to strike target materials to be sputtered in sputter deposition systems are generated by glow-discharges, a glow-discharge being a self-sustaining type of plasma. A plasma may be defined as a partially ionized gas containing an equal number of positive and negative charges, as well as some other number of non-ionized gas particles. Generally, a noble gas, usually argon (although at least neon and xenon have also been employed), comprises the plasma.

One drawback of sputtering is the difficulty in achieving conformal coverage deep within high aspect ratio features on semiconductor wafers. In sputtering, the trajectory of the atomic material sputtered from the target depends in significant part upon the incident angle of the bombarding atom. Accordingly, atoms directed towards the wafer surface come from varying angles, only a relatively small portion of which arrive at the wafer surface in a substantially perpendicular angle in comparison to the other angled atoms. Atoms reaching the substrate surface via nonperpendicular trajectories provide an undesired drawback of not conformally coating deep within high aspect ratio features.

To overcome such a drawback, a device known as a collimator is used. A collimator typically comprises a disk-shaped object having a plurality of holes or openings provided therethrough. The collimator functions effectively as a filter, essentially restricting the path of the sputtered particles to the desired perpendicular or near-perpendicular and allowing only these particles to pass through the collimator and coat the substrate surface, which is normally a semiconductor wafer. This path restriction to substantially perpendicular angled particles results in a more conformal deposition within high aspect ratio features than is possible when a collimator is not used.

Another method used to improve step coverage within contacts is to increase the acceleration of the sputtered particles or ions from the discharge toward their surfaces. The impinging ions transfer energy to surface atoms and cause them to be transported to the sidewalls of steps, where they accumulate and locally increase film thickness.

One aspect of the use of a prior art collimator is that it is mounted in a sputter chamber in such a manner that the collimator and the chamber are both grounded. This grounded configuration causes the collimator to behave as a plasma barrier in both directions.

SUMMARY

The present invention provides a sputter deposition apparatus and method of using the same that allows improved conformal coverage deep within high aspect ratio features on semiconductor wafers and IC's.

The present invention provides a collimator and method of using the same wherein the collimator is not an electrical plasma barrier.

The present invention also employs an rf bias to the substrate (wafer) for enhanced attraction of plasma ions for reactive sputtering as well as control or inhibition of "pinch off" of high aspect ratio features by the deposited film of target material, wherein material deposited at the upper extent of recessed features effectively precludes coverage of the bottoms thereof.

According to the present invention, the collimator is mounted within a sputter chamber and is interposed between a sputter target and a wafer to be coated with a thin film of the sputtered material. The collimator of the present invention is preferably mounted within the sputter chamber in an insulated manner so that the collimator is electrically insulated from the chamber and the collimator is able to take on a floating electrical potential of the plasma generated within the sputter chamber.

Additional objects, advantages and novel features of the invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

DETAILED DESCRIPTION OF THE ILLUSTRATED EMBODIMENT

Figure 1:
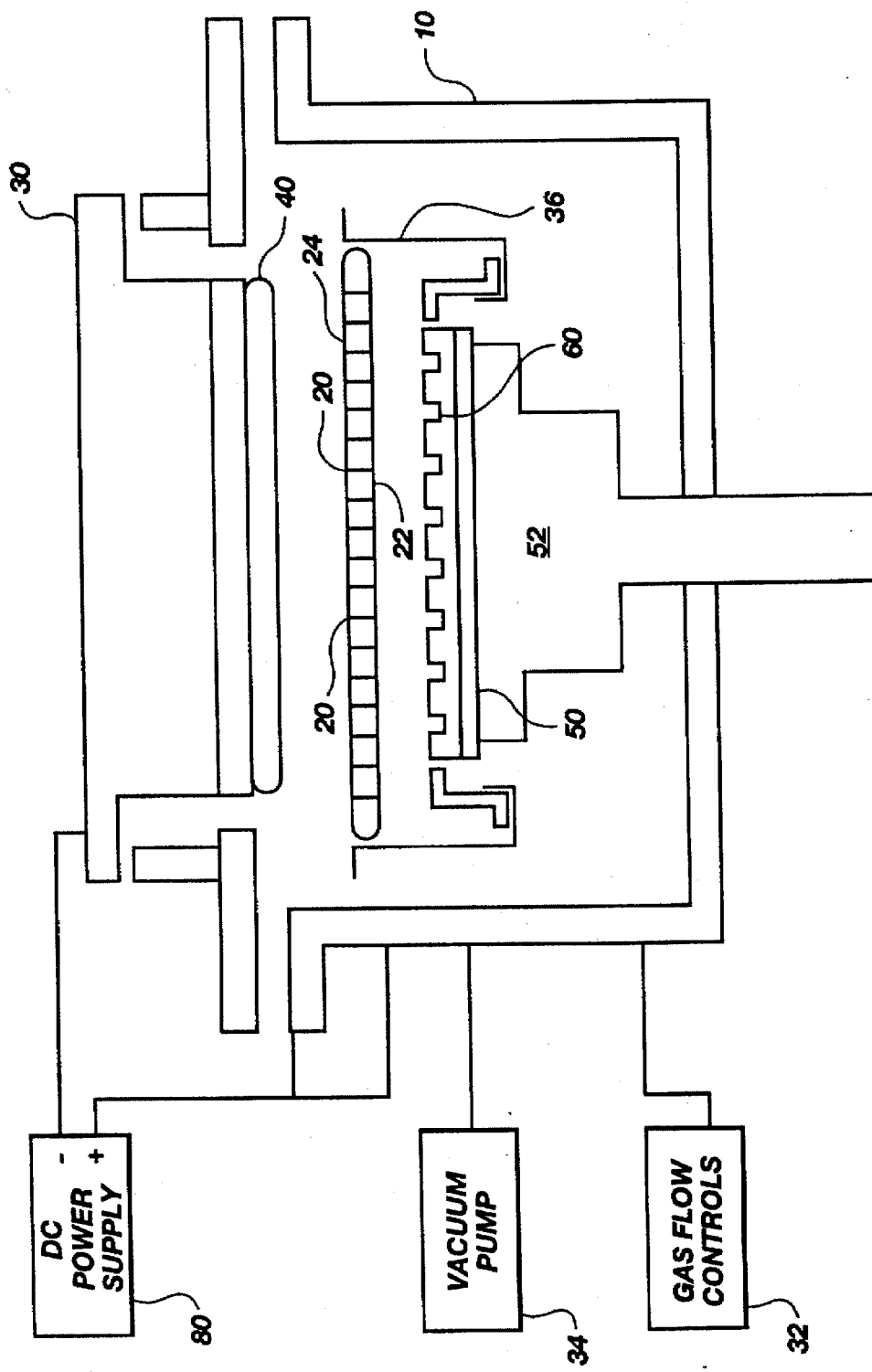
FIG. 1 is a schematic cross-sectional view of a prior art sputter chamber with its collimator grounded to the chamber.

FIG. 1 shows a sputtering chamber 10 equipped with a collimator 20, in a typical prior art configuration. Collimator 20 is located between target mount 30, holding substantially planar target 40, and substrate wafer 50. Wafer 50 includes a plurality of features 60 which are to be filled with sputtered particles deposited onto wafer 50 during sputter coating. Collimator 20 is preferably machined out of a machinable metal, such as aluminum, copper, stainless steel, or titanium, though any suitable material may also be used. The particular material chosen will depend upon the material being sputtered and the respective adherence characteristics of the two materials.

Other standard parts of the sputter apparatus include a gas supply and flow controls 32 to control the gas flow into chamber 10, and an exhaust vacuum pump 34 which creates a vacuum in chamber 10 during processing of substrate wafer 50. A shield 36 surrounds wafer 50.

Collimator 20 includes flat member 22 with a plurality of substantially parallel passages 24 machined therethrough. Collimator 20 is mounted between target 40 and wafer 50. Generally, collimator 20 is mounted approximately halfway between target 40 and wafer 50, but placement of collimator 20 is variable depending upon the particular fabrication objectives.

Figure 2:
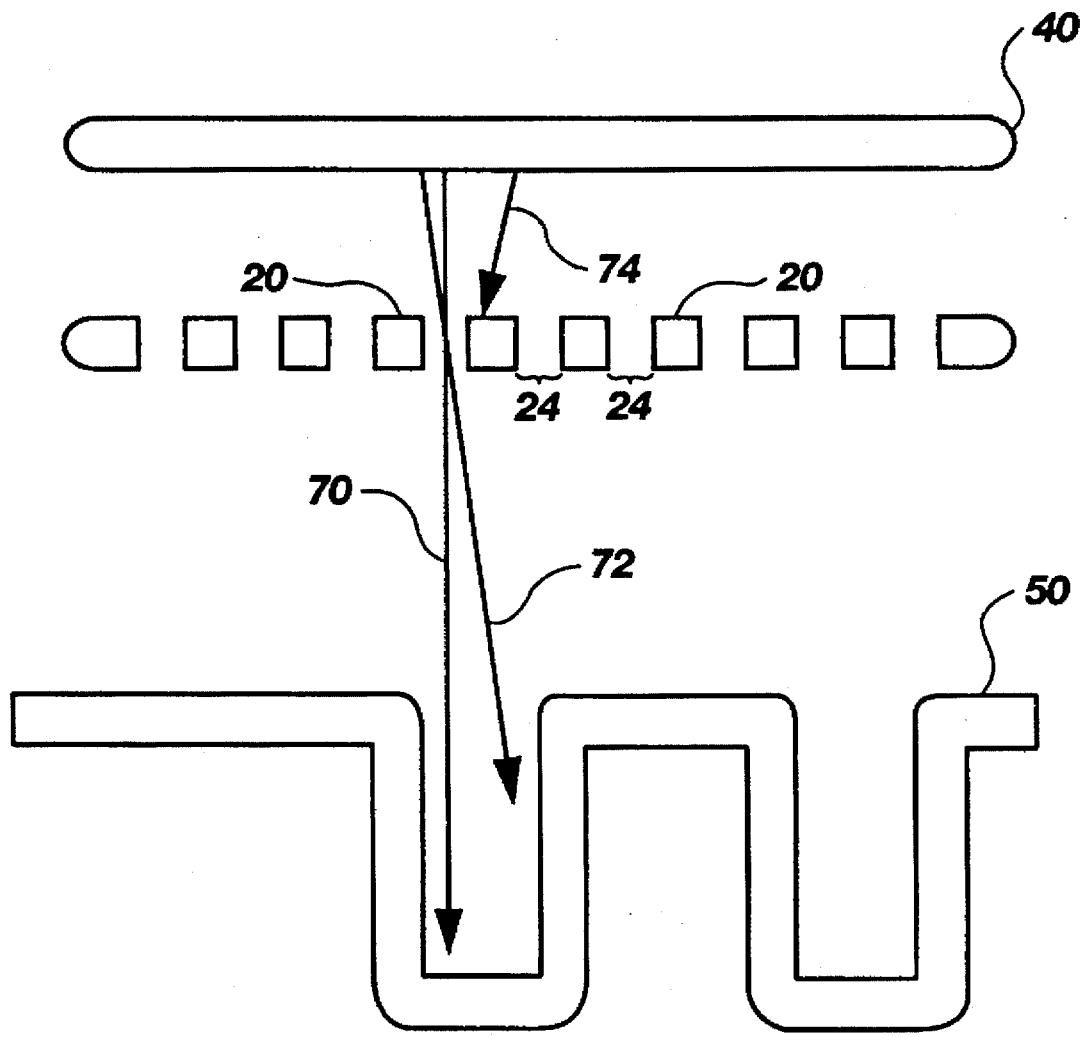
FIG. 2 is a schematic cross-sectional view showing the function of a typical collimator.

The function of collimator 20 can be demonstrated by exemplary directional arrows 70 and 72, in FIG. 2. Directional arrows 70 and 72 depict potential trajectories of travel by sputtered particles as they progress from target 40 to wafer 50. The path of arrow 70 is the ideal trajectory and is a direct, or 90° perpendicular route from target 40 to wafer 50, through passage 24, and is not directionally influenced by the presence of collimator 20. In the case of a sputtered particle traveling along the trajectory of arrow 72, however, the particle is guided unimpeded through one of passages 24 and deposits upon wafer 50. In the case of arrow 74, the trajectory follows an undesirable path and is prevented by collimator 20 from reaching the surface of wafer 50.

During a normal sputtering cycle, as shown in FIG. 1, target mount 30 is connected to power supply 80, establishing a voltage potential between grounded chamber 10 and target 40, mounted onto target mount 30. The negative terminal of power supply 80 is connected to target mount 30 and the positive terminal is grounded to chamber 10. In a typical configuration, as is well known in the art, collimator 20 is mounted in chamber 10 in such a manner that it is grounded to chamber 10. During sputtering, support 52, having substrate 50 thereon, is moved upwardly into a processing position in chamber 10. Positive ions in the plasma generated from the gas resident within chamber 10 are drawn toward and strike or bombard negatively-charged target 40, dislodging or sputtering portions or particles of the target material, which particles are accelerated toward substrate 50, which may be optionally negatively biased.

Figure 3:
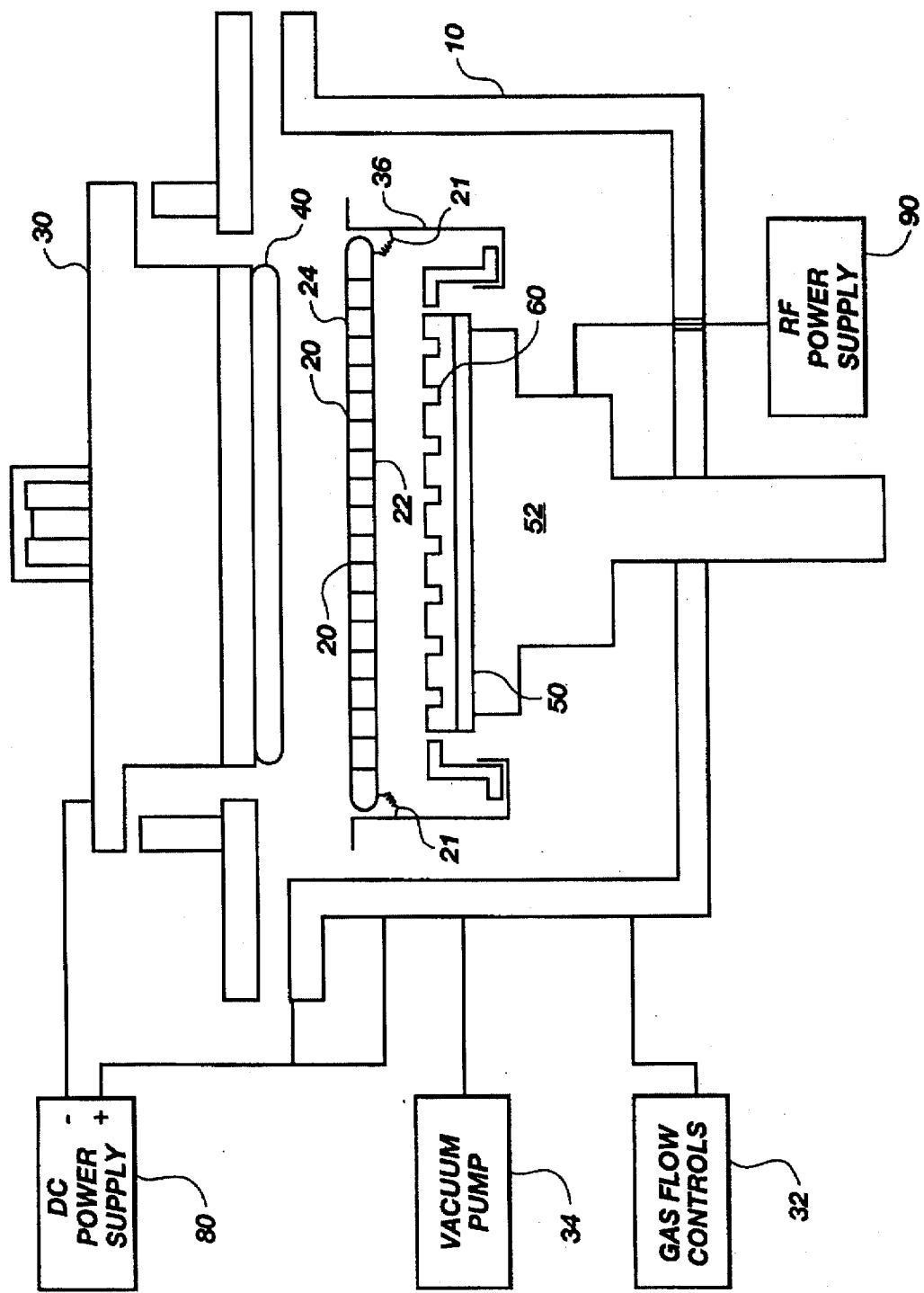
FIG. 3 is a schematic cross-sectional view of a sputtering chamber with collimator mounted in an insulated manner in accordance with the present invention.

FIG. 3 is a schematic view of a sputtering chamber 10 modified in accordance with the present invention having collimator 20 mounted therein between target mount 30 and substrate 50. Collimator 20 for the present purposes is mounted within chamber 10 in an insulated manner so that the collimator is electrically insulated or isolated from the chamber and the collimator is able to take on a floating electrical potential associated or related to that of the plasma generated within chamber 10. In the preferred embodiment, collimator 20 is mounted in chamber 10 using high voltage ceramic insulators 21, but any appropriate means of insulating collimator 20 from chamber 10 can be used.

Target 40 is maintained at a negative, preferably dc, bias during sputtering, while substrate 50 is maintained at a negative potential through, preferably, an rf voltage as shown at 90.

Other illustrated parts of sputter chamber 10 are conventional and the same numerals are used as for similar parts in FIGS. 1 and 2.

Since in the prior art, as in FIG. 1, collimator 20 is grounded to chamber 10, collimator 20 becomes a barrier to plasma passage in both directions.

In the sputter deposition of thin metal and insulating films onto semiconductor wafers, it is desired that the thin films maintain a uniform thickness and freedom from cracks or voids. As sputtered thin films cross steps that occur on the surface of the underlying substrate, they may suffer unwanted deviations from the ideal, such as thinning or cracking. A measure of how well a film maintains its nominal thickness is referred to as the step coverage of the film, and is expressed as the percentage of the nominal thickness that occurs at the step.

Step coverage of 100% is ideal, but each process is normally specified by a lesser minimum value that is acceptable for a given application. The height of the step and the aspect-ratio of the feature being covered also determine the expected step coverage. That is, the greater the height of the step, or the aspect ratio (i.e., the height-to-spacing ratio of two adjacent steps or, with specific reference to holes or vias in a substrate, the depth-to-width ratio), the more difficult it is to cover the step without thinning of the film, and hence the worse the expected step coverage.

There is particular difficulty in obtaining coverage of the lower (e.g., deeper) regions of high aspect-ratio features, over and above the above-mentioned difficulties. This is the result of a phenomenon termed "pinch off," wherein target material deposited at the top or within the mouth of the recessed feature accumulates and narrows the opening through which target material may reach the bottom of the feature. Prior art collimators have purportedly reduced pinch off to some extent. However, the continued reduction in size (especially aperture width) of surface features on a wafer, in combination with increased relative depth of apertures necessitated by the large number of layers employed in state-of-the-art semiconductors, presents increasing step coverage problems even with collimator-reduced pinch off. While high aspect ratio collimators may be used to address this problem, the "over-filtration" of particles attendant to the use of such collimators greatly protracts sputtering times and increases costs for a given film thickness and step coverage.

One method to improve coverage is to increase the acceleration of the plasma ions. The impinging ions from the plasma transfer energy to surface atoms, and cause them to be transported to the sidewalls of steps, where they accumulate and locally increase film thickness.

One advantage of this invention is that insulating collimator 20 from any grounded region of chamber 10 allows collimator 20 to assume a floating electrical potential associated to the electrical potential in the plasma of chamber 10. This floating electrical potential of collimator 20 adds to the energy and velocity of the electrons and ionized particles and increases the electron energy of the plasma. The higher electron energy plasma allows for the plasma to exist at pressures lower than if collimator 20 were grounded to chamber 10. It is desirable to operate sputtering plasmas at as low a pressure as possible when film coverage of high aspect ratio features is a goal. This lower operating pressure of the plasma in chamber 10 as a result of the insulated mounting of collimator 20 represents another and improved way that electrically isolated collimator 20 can facilitate thin metal film sputter deposition in semiconductor and IC fabrication.

Another advantage of this invention is that by electrically isolating collimator 20, plasma passes through it with great ease relative to grounded chamber 10, resulting in substantially enhanced plasma concentration or density between collimator 20 and substrate or wafer 50. Because of this, wafer 50 experiences a much higher flux of ions from the plasma. Certain types of sputtering, for example reactive sputtering, involve the incorporation of components of the sputtering gas into the film. That is, in some circumstances the film reacts with all or some of the sputtering gas and forms a compound film with it. The degree or rate of reaction is aided by ion bombardment and having the reaction components in ionized or excited form.

An insulated collimator, as with this invention, allows for ionized gas components to exist in significant concentrations near the wafer. The bombardment of these ionized gas components will allow for any chemical reactions with the film to proceed faster (i.e. lower the activation energy for reaction). This is important in many cases of reactive sputtering where the partial pressure of the reactive component needs to be kept to a minimum. It is well known that at some partial pressures the sputtering target surface will be reacted. This is almost always accompanied by a dramatic drop in deposition rate. It is desirable to keep the partial pressure low enough to have an unreacted target surface but still have enough of a concentration of reactive gas to produce the desired film. Having ionized reactive species will decrease the reaction activation energy and produce the desired film at a lower partial pressure than in the case of a grounded collimator.

Also, because an insulated collimator allows for significant plasma penetration relative to a grounded one, the effects of application of a negative, preferably by rf, electrical bias to wafer 50 will be enhanced. Electrical biasing of wafer 50 is a common technique used to modify film properties. This includes film stress, step coverage, morphology, and composition to name a few. However, unless plasma exists near the biased wafer features, there will be little or no ion contact with the wafer and minimal enhancement of film properties. Prior art sputtering apparatus and structures, through use of a grounded collimator, effectively precluded a substantial plasma presence in the area between the collimator and the wafer. The present invention, with collimator 20 maintained at its floating potential, essentially neutral with respect to that of the plasma, provides for free passage of the plasma and thus a substantially enhanced presence of plasma ions attracted (and accelerated) by the negative potential of the rf-biased wafer.

In addition to the foregoing advantages of combining an electrically isolated collimator with a negatively-biased wafer, it has been recognized by the inventors that the rf bias of the wafer or substrate, in combination with the enhanced presence of plasma ions in proximity to the wafer, provides for reduction or control of the aforementioned "pinch off" of high aspect ratio features by sputtering of excess target material accumulating in the pinch off region, thus preventing premature narrowing or even closure of the top or entry area of a feature which would preclude insufficient bottom coverage of that feature.

While there is shown and described the preferred embodiment of the invention, it is to be distinctly understood that this invention is not limited thereto but may be variously embodied to practice within the scope of the following claims.

What is claimed is:

1. A sputter coating apparatus for sputter coating a semiconductor wafer, the apparatus comprising:

an evacuable chamber;

a sputter target mounted in said chamber;

a semiconductor wafer support mounted in said chamber opposite said target for supporting said wafer; and a collimator interposed between the target and the semiconductor wafer support and mounted within the chamber in an electrically isolated manner so the collimator is able to take on a floating electrical potential within the chamber during plasma operations of the sputter coating apparatus in which the chamber is evacuated.

2. A method of sputter deposition of a thin film on a semiconductor wafer in an evacuable chamber, the method comprising:

mounting a sputter target in the chamber;

mounting the wafer in the chamber opposite said target;

interposing a collimator between the target and the wafer, and mounting the collimator within the chamber in an electrically isolated manner so the collimator takes on a floating electrical potential within the chamber during plasma operations in which the chamber is evacuated;

creating a vacuum in the chamber; and generating a plasma within the chamber to cause the sputter deposition of a thin film of target material on the wafer.

3. An apparatus for sputter deposition of a material on a semiconductor wafer, the apparatus comprising:

a chamber adapted for creation of a vacuum therein and provided with a supply of an ionizable gas;

a target of said material disposed in said chamber;

a semiconductor wafer support disposed in said chamber spaced from said target; and a collimator interposed between said target and said wafer support and mounted within said chamber in an electrically isolated manner such that said collimator takes on a floating electrical potential within said chamber during plasma operations performed therein at vacuum.

4. The apparatus of claim 3, wherein said wafer support is negatively-biased.

5. The apparatus of claim 4, wherein said negative bias of said wafer support is achieved by an rf voltage.

6. An apparatus for sputter deposition of a material on a semiconductor wafer, the apparatus comprising:

a grounded chamber adapted for creation of a vacuum therein and provided with a supply of an ionizable gas;

a negatively-biased target of said material disposed in said chamber;

a negatively-biased semiconductor wafer support disposed in said chamber spaced from said target; and a collimator interposed between said target and said wafer support and mounted within said chamber in an electrically isolated manner such that said collimator takes on a floating electrical potential within said chamber during plasma operations performed therein at vacuum.

7. The apparatus of claim 6, wherein said negative bias of said wafer support is achieved by an rf voltage.

8. An apparatus for sputter deposition of a material on a semiconductor wafer, the apparatus comprising:

a chamber adapted for creation of a vacuum therein, having at least a portion thereof at a first potential and provided with a supply of an ionizable gas;

a target of said material at a second, different potential disposed in said chamber;

a semiconductor wafer support disposed in said chamber spaced from said target; and a collimator electrically isolated from said chamber and from bias sources external to said chamber during plasma operations performed therein and interposed between said target and said wafer support.

9. The apparatus of claim 8, wherein said second potential is more negative than said first potential.

10. The apparatus of claim 8, wherein said wafer support is at a different potential from said first potential.

11. The apparatus of claim 10, wherein said second potential is more negative than said first potential.

12. A method for sputter deposition of a material on a semiconductor wafer, the method comprising:

providing an evacuable chamber, at least a portion of which is at a first potential;

providing a semiconductor wafer in the chamber;

providing a source of said material for said deposition spaced from said wafer in said chamber;

sputtering said material with a gas plasma resident in said chamber;

providing a collimating apparatus within said chamber and collimating trajectories of sputtered material particles to features on the surface of said wafer with said collimating apparatus to form a film of said material on said wafer; and electrically isolating said collimating apparatus from said first potential and from bias sources external to said chamber during plasma operations performed within said chamber at vacuum.

13. The method of claim 12, further comprising maintaining said material source at a second potential different from said first potential, and maintaining said wafer at a third potential different from said first potential.

14. The method of claim 13, wherein said first potential comprises ground.

15. A method for sputter deposition of a material on a semiconductor wafer including high aspect-ratio features on the surface thereof, the method comprising:

providing an evacuable chamber having at least a portion thereof at a first potential;

providing a wafer including said high aspect-ratio features within said chamber at a second potential different from said first potential;

providing a source of said material for said deposition spaced from said wafer in said chamber;

sputtering said material with a gas plasma resident in said chamber;

providing a collimating apparatus within said chamber and collimating trajectories of sputtered material particles to features on the surface of said wafer with said collimating apparatus to form a film of said material on said wafer;

electrically isolating said collimating apparatus from said first potential and from bias sources external to said chamber during plasma operations performed within said chamber at vacuum; and substantially reducing pinch off of said material proximate entry regions to said high aspect ratio features with said second potential.

16. The method of claim 15, wherein said pinch off is substantially reduced through sputtering of deposited material from said entry regions attributable to said second potential.

17. The method of claim 15, further including maintaining said gas plasma at a floating potential, and collimating said sputtered material particles at a potential associated with said floating potential of said gas plasma.

18. A method for sputter deposition of a material on a semiconductor wafer including recesses in the surface thereof, comprising:

providing a semiconductor wafer in an evacuable chamber;

providing a source of said material for said deposition spaced from said wafer in said chamber;

sputtering said material with a gas plasma resident in said chamber;

maintaining said gas plasma at a floating electrical potential;

providing a collimating apparatus within said chamber and collimating trajectories of sputtered material particles to features on the surface of said wafer with said collimating apparatus at a potential associated with said floating electrical potential of said gas plasma to form a film of said material on said wafer and within said recesses; and electrically isolating said collimating apparatus from said chamber and from bias sources external to said chamber during plasma operations performed within said chamber at vacuum.

19. The method of claim 18, further including maintaining said wafer at a potential different from said floating potential of said gas plasma, and sputtering portions of said material film from said wafer to enhance step coverage of said wafer.

20. The method of claim 19, further including achieving said enhanced step coverage by inhibiting pinch off at entry regions of recesses on said substrate.

21. A method for sputter deposition of a target material on a semiconductor wafer, the method comprising:

providing the target material and the wafer spaced apart from one another in a sputter deposition chamber;

providing a collimator between the target material and the wafer in the chamber;

electrically isolating the collimator from the chamber and any bias sources external to the chamber during plasma operations under vacuum within the chamber;

evacuating the chamber;

inducing a voltage differential between the chamber and the target material to generate a plasma within the chamber;

bombarding the target material with ions from the plasma to dislodge material particles therefrom;

collimating trajectories of the dislodged material particles to features on the wafer with the collimator to form a film of the target material on the wafer;

operating the collimator at a floating electrical potential during sputter deposition so the plasma has more energy than if the collimator were operated at ground potential and so the plasma freely flows through the collimator;

operating the chamber at a reduced pressure as a consequence of the collimator being operated at a floating electrical potential and the plasma thereby having relatively more energy; and biasing the wafer with a negative rf-voltage to substantially enhance the presence of the free-flowing plasma near the wafer and thereby reduce pinch-off of features on the wafer.

22. A method for sputter deposition of a target material on a semiconductor wafer, the method comprising:

providing the target material and the wafer spaced apart from one another in a sputter deposition chamber;

generating a plasma within the chamber;

bombarding the target material with ions from the plasma to dislodge material particles therefrom;

at a floating electrical potential of the plasma, collimating trajectories of the dislodged material particles to features on the wafer to form a film of the target material on the wafer; and operating the chamber at a pressure that is less than a pressure the chamber would be operated at if trajectories of the dislodged material were collimated at an electrical potential of the chamber.

23. A method for sputter deposition of a target material on a semiconductor wafer, the method comprising:

providing the target material and the wafer spaced apart from one another in a sputter deposition chamber;

generating a plasma within the chamber;

bombarding the target material with ions from the plasma to dislodge material particles therefrom;

at a floating electrical potential of the plasma, collimating trajectories of the dislodged material particles to features on the wafer to form a film of the target material on the wafer; and biasing the wafer to substantially enhance the presence of the plasma near the wafer.

* * * * *